(12) United States Patent
Wu et al.

(10) Patent No.: US 10,396,124 B2
(45) Date of Patent: Aug. 27, 2019

(54) MEMORY CELLS AND DEVICES

(71) Applicant: Xerox Corporation, Norwalk, CT (US)

(72) Inventors: Jin Wu, Rochester, NY (US); Lin Ma, Pittsford, NY (US)

(73) Assignee: XEROX CORPORATION, Norwalk, CT (US)

(*) Notice: Subject to any disclaimer, the term of this patent is extended or adjusted under 35 U.S.C. 154(b) by 174 days.

(21) Appl. No.: 15/641,729

(22) Filed: Jul. 5, 2017

(65) Prior Publication Data

US 2019/0013356 A1 Jan. 10, 2019

(51) Int. Cl.
*H01L 27/24* (2006.01)
*C09D 4/00* (2006.01)
*H01L 45/00* (2006.01)
*G11C 11/22* (2006.01)

(52) U.S. Cl.
CPC ............ *H01L 27/2463* (2013.01); *C09D 4/00* (2013.01); *G11C 11/22* (2013.01); *H01L 45/10* (2013.01); *H01L 45/1233* (2013.01); *H01L 45/14* (2013.01); *Y10T 428/105* (2015.01); *Y10T 428/1164* (2015.01)

(58) Field of Classification Search
CPC . H01L 27/2463; H01L 45/14; H01L 45/1233; H01L 45/10; H01L 23/562; H01L 43/12; G11C 11/22; G11C 11/161; C09D 4/00; Y10T 428/105; Y10T 428/1059; Y10T 428/1164

USPC ...... 428/814, 1.33, 1.5, 1.52, 1.54; 156/275, 156/332; 313/512
See application file for complete search history.

(56) References Cited

U.S. PATENT DOCUMENTS

| | | |
|---|---|---|
| 3,720,862 A | 3/1973 | Mason |
| 4,713,157 A | 12/1987 | McMillan et al. |
| 5,214,300 A | 5/1993 | Rohrer et al. |
| 7,374,954 B2 | 5/2008 | Kang |
| 9,412,705 B2 | 8/2016 | Karlsson et al. |
| 10,249,625 B1 | 4/2019 | Herko et al. |
| 2007/0049155 A1 | 3/2007 | Moro et al. |
| 2007/0138520 A1 | 6/2007 | Leenders et al. |
| 2011/0157682 A1* | 6/2011 | Zang ............ C08G 18/672 359/296 |
| 2013/0256673 A1* | 10/2013 | Nishiyama ........ H01L 29/78606 257/59 |
| 2014/0210026 A1* | 7/2014 | Karlsson ............ G11B 9/02 257/422 |

FOREIGN PATENT DOCUMENTS

| WO | WO2006135245 | 12/2006 |
|---|---|---|
| WO | WO2006135246 | 12/2006 |
| WO | WO2006135247 | 12/2006 |

* cited by examiner

*Primary Examiner* — Ruiyun Zhang
(74) *Attorney, Agent, or Firm* — Bell & Manning, LLC

(57) ABSTRACT

Disclosed are memory cells that include a crosslinked mixture of a photoinitiator, a polyether-modified acrylate oligomer, a polyester acrylic resin, and a component selected from the group consisting of a silicone acrylate oligomer, and a fluorinated acrylate oligomer, and memory devices that contain a plurality of memory cells.

18 Claims, 1 Drawing Sheet

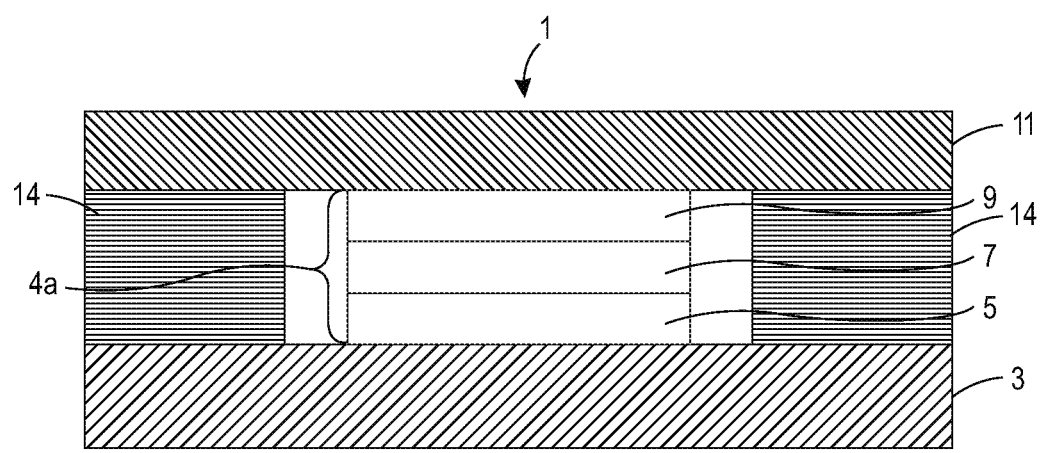

MEMORY CELLS AND DEVICES

The present disclosure is generally directed to a memory cell, and memory devices derived therefrom, comprising a polyether-modified acrylate oligomer, a polyester acrylic resin, a silicone acrylate oligomer, or a fluorinated acrylate oligomer, and a photoinitiator.

BACKGROUND

Certain memory cells that contain a plurality of protective coatings, such as two protective coatings of a buffer layer and a hard coat layer thereover, are known. For example, there have been disclosed specific memory cells that include two coatings of a buffer layer, or a soft layer, and a protective hard coat layer.

Memory cells can be generated by flexible electronics, that is there are known processes for assembling electronic circuits by making, or otherwise providing electronic devices with flexible plastic substrates, such as polyimides, or certain transparent conductive polyester films, where the circuits can be screen printed on such substrates, or certain other substrates. Flexible electronic assemblies thus may be manufactured with many of the same components used for the preparation of rigid printed circuit boards, where being flexible allows these assemblies to conform to a desired shape, or to flex during their use. Also, flexible electronics can refer to various etching techniques for forming known thin silicon substrates. Flexible printed circuits (FPC), also known as flex circuits, can be prepared by photolithographic technology by, for example, laminating very thin copper strips in between two layers of a polyester polyethylene terephthalate (PET), about 0.05 millimeter thick, and where there is present a base material or substrate of, for example, a polyester, a polyimide, a polyethylene naphthalate, or a polyetherimide, and where a metal foil like copper is used as the conductive element from which the circuit paths are normally etched.

A number of disadvantages are associated with electronic devices, such as for example, they can be costly to fabricate, the layers that are present, such as the buffer layer and the protective layer, tend to separate from each other and from the other layers like electrodes thereby rendering the devices inoperable for their intended purposes causing, for example, some of the layers that contain exposed materials, or protrusions on their surfaces to adversely affect the characteristics of the layers involved and disrupt the functions of these layers. Additionally, electronic devices that include memory cells with two, or more protective layers involve complex design parameters. Moreover, memory devices and memory cells can possess undesirable surface roughness primarily because of the migration of chemical substances like oligomers to their surfaces, which in turn degrades the optical and electrical performance of the devices. Many of the known memory devices are prepared by a stepwise sequence that decreases yields, increases cost, and results in unacceptable surface roughness.

There is a need for memory cells, memory devices, and compositions thereof that minimize, or substantially eliminate the disadvantages illustrated herein.

A need also exists for memory devices with a single protective layer, and which devices can be generated with design simplicity.

Also, there is a need for devices that contain layers that are free, or substantially free of separation.

Further, there is a need for memory cells with a single protective layer, and where the thickness of each of the layers present remains constant for extended time periods.

A need exists for a protective coating that prevents, or minimizes a deterioration in the properties and loss of function of the memory cell layers present.

There is also a need for memory cells and devices thereof where a single protective coating is present, and where the coating is engineered to possess low shrinkage characteristics and excellent coating properties, and where the coating minimizes the impacts like changing the properties and adversely affecting a device that contains electrodes and other layers.

Additionally, there is a need for economically generated memory cells and devices that include a single protective layer.

Yet another need resides in providing devices and compositions thereof that possess acceptable surface roughness, and where the surface possesses smooth characteristics.

There is also a need for memory cells with a protective layer that has excellent chemical stability.

Moreover, needed are memory devices that are thermally stable, and where the electrodes present, such as silver electrodes, retain their conductivity.

Further, there is desired the preparation of devices generated by economical roll to roll processes, and where with these cells there are minimal short circuits.

These and other needs and advantages are achievable in embodiments with the processes and compositions disclosed herein.

SUMMARY

Disclosed is a memory cell comprising a crosslinked mixture of a polyether-modified acrylate oligomer, a polyester acrylic resin, and a component selected from the group consisting of a silicone acrylate oligomer, and a fluorinated acrylate oligomer, and a photoinitiator.

Also disclosed is a memory cell comprising, in sequence, a flexible substrate layer, a first electrode in contact with said substrate layer, a ferroelectric memory layer, a second electrode in contact with said ferroelectric memory layer, and in contact with said second electrode a protective layer comprised of a crosslinked mixture of a polyether-modified acrylate oligomer, a polyester acrylic resin, a component selected from the group consisting of a silicone acrylate oligomer, a fluorinated acrylate oligomer, and a photoinitiator, and which protective layer is in contact with the second electrode.

Further, disclosed is memory device comprising a plurality of memory cells wherein each memory cell comprises a flexible substrate layer, a first electrode in contact with said substrate layer, a ferroelectric memory layer in contact with said first electrode, a second electrode in contact with said ferroelectric layer, and a protective layer in contact with said second electrode and wherein said protective layer comprises a crosslinked mixture comprising a polyether-modified acrylate oligomer, a polyester acrylic resin, a component selected from the group consisting of a silicone acrylate oligomer, and a fluorinated acrylate oligomer, and a photoinitiator.

Additionally, disclosed is a memory cell comprising a crosslinked mixture of a polyether-modified acrylate oligomer, a polyester acrylic resin, a silicone acrylate oligomer, and a photoinitiator, and memory devices thereof.

Yet further, there is disclosed a memory cell comprising a crosslinked mixture of a polyether-modified acrylate oligomer, a polyester acrylic resin, a fluorinated acrylate oligomer, and a photoinitiator, and memory devices thereof.

FIGURE

FIG. 1 illustrates exemplary embodiments of the systems, devices, compositions, and processes of the present disclosure.

In FIG. 1 there is illustrated a memory cell 1 comprising a substrate, such as a flexible substrate 3, a first or bottom electrode 5, which can be a patterned electrode, a ferroelectric memory material layer 7, a second or top electrode 9 that can also be a patterned electrode, support spacers 14, arranged on the substrate 3, adjacent opposite ends of electrically conductive component layers 4a, and a protective layer 11, and where the spacers 14 can, for example, be provided by commercially available strips of tape arranged parallel to the electrodes of the memory device, or by strips or dots that are printed thereon, and where a plurality of such types and/or forms of memory cells can become operatively and functionally connected electrically to provide an exemplary memory device.

Accordingly, each disclosed memory device comprises an array of the disclosed memory cells, where a polarization state of an individual memory cell can be provided, for example, by applying appropriate voltages to the electrodes contained in the memory cell, or to several memory cells, and which memory cells, as well as various devices derived therefrom, can be generated by flexible printed electronics.

The disclosed cells, which can be generated by at least one of ink jet printing, gravure printing, screen printing, stamp printing, intaglio printing, offset printing, flexogram printing, laser printing, electrographic printing, wax jet printing, lithography, and the like, and where there is present a UV cured protective layer, can be selected for data storage devices, memory devices, thin film transistors, semiconductors, optical disks, magnetic tapes, and generally devices that retain information for retrieval. Thus, the disclosed flexible memory cells can be referred to as capacitor like structures where the memory substance is a ferroelectric polymer located between two electrodes, and where the memory cell is accessed by conductors linking the electrodes to electronic drivers. Each patterned memory device may contain one individual memory cell, up to several millions of individual cells, such as from about one cell to about 1,000,000 cells arranged, for example, in matrix arrays, and where the layers thereof, such as for example, the first electrode, the ferroelectric memory layer, and second or top electrode, can be printed using commercially available ink jet systems and processes. Also, the disclosed memory cells and the disclosed memory devices may be printed on packaging materials, labels, tags, and various articles-of-manufacture including, but not limited to, books, bottles, clothes, electronics, paper products, and the like.

Substrates

Examples of substrates, and more specifically flexible substrates selected for the disclosed memory cells, especially those with a thermal stability of up to at least about 200° C., include various polymers, such as polyesters, and more specifically MYLAR®, polyethylene terephthalate (PET: Lumirror 41.31) available from E.I. DuPont Chemical Company, polyethylene naphthalate (PEN), polytetrafluoroethylenes, such as TEFLON®, polystyrenes, polypropylenes, polyethylenes, polyvinyl chlorides, polyvinylidene chlorides, polymethyl methacrylates, polyvinyl acetates, polycarbonates, polyimides, polyamides, polyamideimides, mixtures thereof, and the like.

The substrate can be of various effective suitable thicknesses, such as for example, from about 5 microns to about 100 microns, from about 25 microns to about 75 microns, or from about 40 microns to about 55 microns as determined with a Permascope, and as determined by other known methods, such as an electron microscope.

Flexible refers, for example, to a material, such as the disclosed substrates that can be bent, or shaped without damage, that is capable of significant bending, such as following the curvature of a curved object like a drum comparatively easily and without breaking, and can be easily returned to their original shape, such as flat versus, for example, silicon substrates which are rigid and usually cannot be bent, or shaped without damage like silicon substrates that can break or crack severely when trying to bend them.

Electrodes

Electrodes in various suitable thicknesses, such as for example, from about 25 nanometers to about 200 nanometers, from about 50 nanometers to about 150 nanometers, from about 75 nanometers to about 125 nanometers, and from about 100 nanometers to about 110 nanometers, selected for the disclosed memory cells are usually comprised of a suitable electrically conductive metal, such as silver. However, other known suitable electrode substances may be selected, such as copper, gold, aluminum, graphene, carbon nanotubes, graphite, and other carbon forms.

Ferroelectric Layer Components

Examples of ferroelectric memory components for the disclosed memory cells and memory devices can be, for example, organic, such as at least one of an oligomer, a copolymer, a terpolymer, a polymer blend, or mixtures thereof. More specifically, the ferroelectric layer includes known ferroelectric memory components, such as copolymers of polyvinylidene fluoride and trifluoroethylene (P(VDF-TrFE)), fluorine containing polymers, such as polyvinylidene fluoride (PFVD), copolymers of poly(vinylidene fluoride trifluoroethylene), polyvinylidene cyanide (PVCN) polymers, copolymers, terpolymers, and blends containing polymethylmethacrylates, and mixtures thereof, and related polymers with polarizable end groups. Also, in some instances lead zirconate titanate (PZT), lead titanate, $PbTiO_3$, and lead lanthanum zirconate titanate (PLZT) may be selected for the disclosed ferroelectric layer.

The ferroelectric layer components, such as the disclosed polymers and other known suitable materials, are usually present in an amount of 100 percent, however, suitable amounts of less than 100 percent may be selected, such as for example from about 75 percent to about 99 percent, from about 75 percent to about 95 percent, or from about 85 to about 95 percent.

The thickness of the ferroelectric layer is, for example, from about 75 nanometers to about 225 nanometers, from about 125 nanometers to about 200 nanometers, or from about 125 nanometers to about 150 nanometers, as measured with an electron microscope.

Protective Coating

The coating, such as a UV curable protective coating, comprises a mixture of a polyether-modified acrylate oligomer, a polyester acrylic resin, a silicone acrylate oligomer, or a silicone acrylate oligomer, a fluorinated acrylate oligomer, and a photoinitiator in, for example, a weight ratio of about 47/47/2/4, about 42/52/2/4, about 30/62/4/4, about 40/55/2/3, about 45/50/2/3, about 47/48/3/2, about 48/49/1/2, other effective ratios, and the like. The thickness of the protective layer is, for example, from about 1 micron to about 30 microns, from about 5 microns to about 20 microns, or from about 6 microns to about 15 microns, as measured with an electron microscope.

Polyether-Modified Acrylate Oligomers

Examples of polyether-modified acrylate oligomers included in the protective coating mixture are ethoxylated trimethylolpropane triacrylates as represented, for example, by the following formula/structure

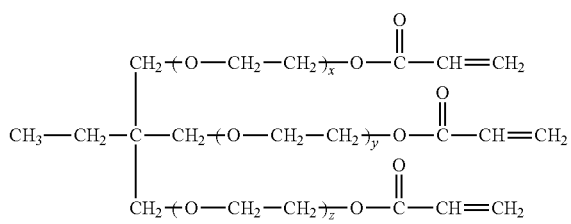

where x is from about 1 to about 10, y is from about 1 to about 10, z is from about 1 to about 10, and the sum of x+y+z is from about 3 to about 24, wherein x is from about 1 to about 6, y is from about 1 to about 6, z is from about 1 to about 6, and the sum of x+y+z is from about 3 to about 16, or wherein x is 2, y is 2 and z is 2.

The polyether-modified acrylate oligomer may be LAROMER® LR 8863 (molar mass=530 g/mol) available from BASF Corporation, LAROMER® P094F available from BASF Corporation, SR502 (molar mass=692 g/mol) available from Sartomer Americas of Pennsylvania, SR415, available from Sartomer Americas of Pennsylvania, other known polyether-modified acrylate oligomers, such as those oligomers disclosed in U.S. Pat. No. 7,858,279, the disclosure of which is totally incorporated herein by reference, and the like.

The LAROMER® LR 8863 is believed to possess the following formula/structure

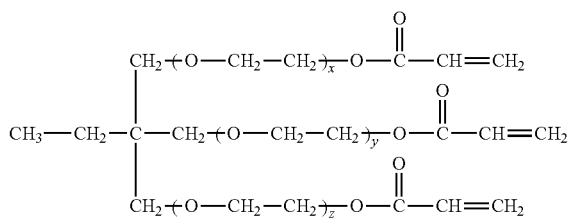

wherein x is 2, y is 2, and z is 2.

Polyester Acrylic Resins

Polyester acrylic resin examples include, for example, those with a viscosity at 23° C. of from about 10,000 cps to about 200,000 cps, or from about 20,000 cps to about 100,000 cps like LAROMER® PE 9079 (reported viscosity at 23° C. of 78,500 cps), LAROMER® PE55F, available from BASF Corporation, B-501M, available from Guangzhou Bossin Chemical Technology Company, and polyester acrylic resins available from European Coatings and available from Alibaba Incorporated.

Silicone Acrylate Oligomers

Examples of silicone acrylate oligomers include siliconized urethane acrylate oligomers, such as CN990 (functionality=2, $T_g$=−37° C., surface tension=22 dyne/cm, viscosity at 60° C.=1,820 cps), available from Sartomer Americas (Sartomer USA, LLC), difunctional silicone urethane acrylate oligomers, aliphatic silicone acrylate oligomers, such as CN9800 (functionality=2, $T_g$=−19° C., surface tension=21 dyne/cm), available from Sartomer Americas (Sartomer USA, LLC), difunctional aliphatic silicone acrylate oligomers, available from Sartomer Americas (Sartomer USA, LLC), suitable silicone acrylate oligomers as illustrated in European Coatings Literature, Wernfried Heilen, Silicone Resins and Their Combinations, Vicentz Network Gmbh and Company KG Germany, the disclosure of which is totally incorporated herein by reference.

Fluorinated Acrylate Oligomers

Fluorinated acrylate oligomer examples include polyfluoropolyether urethane acrylates, such as FLUOROLINK® AD1700 (functionality=4, fluoro content=24 weight percent) available from Solvay Chemicals, and believed to be represented by the following structure

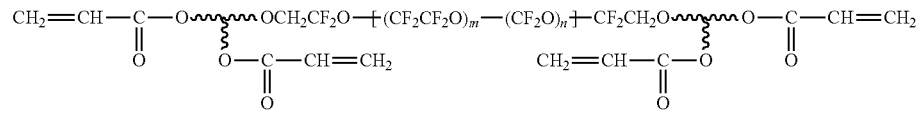
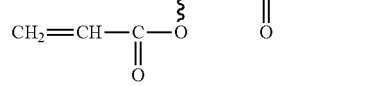

where m is from 1 to about 25, from 1 to about 15, from 1 to about 10, or from 1 to about 5; n is from 1 to about 25, from 1 to about 15, from 1 to about 10, or from 1 to about 5; fluorinated acrylate oligomers available from Sartomer Americas, such as Sartomer CN4000, other known suitable fluorinated acrylate oligomers, and the like.

Photoinitiators

Examples of photoinitiators, which for example initiates the polymerization of monomers and oligomers with UV irradiation, include those illustrated in U.S. Pat. No. 8,338,536, assigned to Henkel Corporation, the disclosure of this patent being totally incorporated herein by reference, and U.S. Patent Publication 20090298970 based on WO Publication 2008085286A1, the disclosures of both of these publications being totally incorporated herein by reference. More specifically, photoinitiator examples include those available from IGM Resins, BASF, and Sartomer, Americas Inc., Exton, Pa. as ESACURE® and SARCAT®, such as ESACURE® KB1 (benzil dimethyl ketal), ESACURE® EB3 (a mixture of benzoin and butyl ethers), ESACURE® TZT (a trimethylbenzophenone blend), ESACURE® KIP100F (hydroxy ketone), ESACURE® KIP150 (a polymeric hydroxy ketone), ESACURE® KT37 (a blend of ESACURE® TZT and KIP150), ESACURE® KT046 (a blend of triphenyl phosphine oxide, ESACURE® KIP150 and ESACURE® TZT), ESACURE® X33 [a blend of 2- and 4-isopropylthioxanthone, ethyl 4-(dimethyl amino) benzoate and ESACURE® TZT]; SARCAT® CD 1010 [triaryl sulfonium hexafluoroantimonate (50 percent in propylene carbonate)], SARCAT® DC 1011 [triaryl sulfonium hexafluorophosphate (50 percent n-propylene carbonate)], SARCAT® DC 1012 (diaryl iodonium hexafluoroantimonate), SARCAT® K185 [triaryl sulfonium hexafluorophosphate (50 percent in propylene carbonate)], and LAURIN® TPO-L (ethyl-2,4,6 trimethylbenzoylphenyl phosphinate) available from BASF Chemicals, optionally mixtures thereof, and the like.

Additional Protective Layer Components

The protective layer may also include additional components, such as reactive components like a hexanediol diacrylate, a tripropyleneglycol diacrylate, a dipropyleneglycol diacrylate, mixtures thereof, and the like in amounts, for example, of from about 0.1 weight percent to about 5 weight percent based on the layer solids. Further, the protective UV curable layer can be diluted with various solvents, such as esters, ketones, or aromatic hydrocarbons, and where the solvents can be completely flashed off, and removed or removed from the coating prior to curing. Yet additionally, the UV curable protective layer composition may include an amine synergist present in an amount of from about 0.1 weight percent to about 1 weight percent based on the layer solids, such as low molecular weight tertiary amine compounds, and/or acrylated amines, that primarily function to increase reactivity. The amine synergist may be, for example, triethanol amine and/or methyl diethanol amine.

Curing

Curing of the disclosed protective coating mixture can be accomplished by a number of know methods, such as by heating, electron beam radiation, or visible light, and more specifically by Ultraviolet light sources. Ultraviolet curing (UV curing) has been described as a photochemical process where light in place of heat, or an electron beam is used, and in which high intensity ultraviolet light is generated to instantly cure. Thus, the protective coating mixtures disclosed herein can be subjected to UV energy from, for example, mercury vapor lamps, fluorescent lamps, LED sources, and the like.

The disclosed protective layer mixture can be cured with a XENON® UV lamp with, for example, a pulse rate of up to about 100 pulses per second and with up to about 507 J/s energy, and with mercury lamps, and where in the disclosed roll-to-roll fabrication processes operates, for example, at a speed of from about 10 feet/minute (0.051 m/s) to about 40 feet/minute (0.20 m/s).

While not desiring to be limited by theory, it is believed that the crosslinking percentage of the protective coating mixture subsequent to curing is, for example, as illustrated herein, such as from about 40 percent to about 100 percent, from about 90 percent to about 100 percent, from about 70 percent to about 100 percent, from about 95 percent to about 99 percent, from about 50 percent to about 99 percent, from about 85 percent to about 99 percent, from about 75 percent to about 98 percent, from about 80 percent to about 100 percent, from about 77 percent to about 97 percent, or from about 70 percent to about 90 percent, and which crosslinking percentages were determined by Fourier Transform Infrared (FTIR) Spectroscopy.

The amount of crosslinking ranges for each of the disclosed coating mixture components can vary, and depends, for example, on many factors, such as the crosslinking percentage desired.

Roll-to-Roll Processes

Roll-to-roll (R2R) encompasses a range of processes wherein the disclosed substrates are transferred between two moving rolls, and where these processes have both a time and spatial occurrence with specific customization to achieve the desired process outcomes; see *Nanofabrication Technologies for Roll to Roll Processing Report from the NIST-NNN Workshop*, Sep. 27 to 28, 2011, edited by Jeffery D. Morse, Ph.D., the disclosure of this workshop article being totally incorporated herein by reference. See also U.S. Pat. Nos. 9,076,975 and 9,058,981, both of which are totally incorporated herein in their entirety.

Roll-to-roll processes are advantageous because of their low unit costs, high volume rates of production, process efficiency through sequential application of successive layers, energy and materials efficiency, and versatility in the types of devices that can be generated.

In the roll-to-roll processes of fabricating the disclosed memory cells, a first electrode is extrusion coated onto a substrate, followed by the extrusion coating of the ferroelectric layer, gravure coating the top silver electrode, and screen coating the protective layer.

The coatings and other layers of the disclosed devices can also be formed by printing them with, for example, ink jet processes.

Specific embodiments will now be described in detail. These examples are intended to be illustrative, and are not limited to the materials, conditions, or process parameters set forth therein. All parts are percentages by weight of solids unless otherwise indicated. The crosslinking percentages were determined by Fourier Transform Infrared (FTIR) Spectroscopy.

EXAMPLE I

Two coating solutions #1 and #2 were prepared by mixing the polyether modified acrylate LAROMER® LR 8863, as represented by the following formulas/structures, the polyester acrylate LAROMER® PE 9079, the siliconized urethane acrylate oligomer SARTOMER® CN990 and the photoinitiator ESACURE® KT046 together in the weight ratio for solution #1 of 47/47/2/4 (viscosity=2,000 cps), or for solution #2 in the weight ratio of 42/52/2/4 (viscosity=2, 700 cps), respectively, resulting in translucent homogeneous coating solutions. Each of the resulting solutions were separately provided to the top of a disclosed first memory device and a second memory device respectively to a level of the carbon PAD (spacers 14) using a screen, available from DEK Horizon 03iX screen printer, and subsequently UV cured by a XENON LH-830 process where the curing speed is about 20 feet/min (0.1016 m/s) for each coating #1 and #2, respectively. Each of the UV cured coatings were about 15 microns thick with a crosslinked percentage of 95 for coating #1 and 99 percent for coating #2, and there were obtained excellent protective layer coating qualities with no bubbles, no spreading, and no curl.

The functionality of the above individually prepared memory cells was tested using a single device tester available from Thin Film Electronics ASA, and the memory cell yields as determined by the single device tester were about 80 percent with coating mixture #1, and 85 percent with coating #2 versus about a 20 percent yield for a similar known memory cell that includes a buffer layer of a silane-terminated polypropylene glycol, and as a protective layer a crosslinked mixture of UV curable varnish, such as Sun Chemical UV6630.

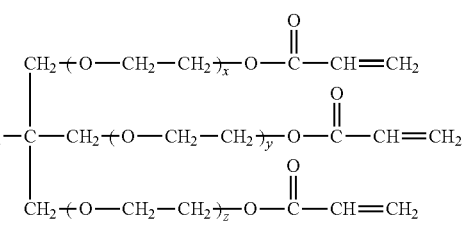

LAROMER® LR 8863 wherein x=2, y=2 and z=2.

EXAMPLE II

The above two prepared coating solutions #1 and #2 were each individually used to obtain the following memory devices.

There were then prepared two memory devices, each comprising a plurality of stacked memory cells by providing a PEN 50 μm thick substrate on top of which a 100 nanometers thick (patterned) bottom silver electrode was gravure printed. Subsequently, a 150 nanometers thick copolymer of polyvinylidene fluoride and trifluoroethylene (P(VDF-TrFE)) ferroelectric memory material layer was extrusion coated (as a global layer) on the bottom silver electrode layer, and then a 100 nanometers thick (patterned) top silver electrode was gravure printed on the top of the ferroelectric layer. Subsequently, there was provided a protective layer film of coating mixture (#1), and a protective layer film coating mixture (#2), respectively, each 15 microns in thickness, in contact with the second top electrode. After UV curing with the XENON LH-830 curing system there resulted a crosslinked protective layer coating of mixture #1 and mixture #2, respectively, and where the crosslinking percentage was 95 percent and 99 percent, respectively.

There will result, it is believed, no negative impacts on the conductivity of the silver electrodes by the disclosed UV cured layer coatings (#1) and (#2); the substrates will be smooth, the memory cell layers will adhere to each other for extended time periods, no bubbling, spreading, or curl are believed to be present in the memory devices, there is a reduction in short circuits, and the substrates remained flat with no curl as determined by visual observation.

The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others. Unless specifically recited in a claim, steps or components of claims should not be implied or imported from the specification or any other claims as to any particular order, number, position, size, shape, angle, color, or material.

What is claimed is:

1. A memory cell comprising a protective layer in the form of a crosslinked mixture of a polyether-modified acrylate oligomer; a polyester acrylic resin; a component selected from the group consisting of a silicone acrylate oligomer and a fluorinated acrylate oligomer; and a photoinitiator, wherein the polyether-modified acrylate oligomer, the polyester acrylic resin, the component, and the photoinitiator are present at a ratio in a range of from about 30/62/4/4 to about 48/49/1/2.

2. A memory cell in accordance with claim 1 wherein said component is the silicone acrylate oligomer.

3. A memory cell in accordance with claim 1 wherein said component is the fluorinated acrylate oligomer.

4. A memory cell in accordance with claim 1 wherein said polyether-modified acrylate oligomer is an ethoxylated trimethylolpropane triacrylate represented by the following formula/structure

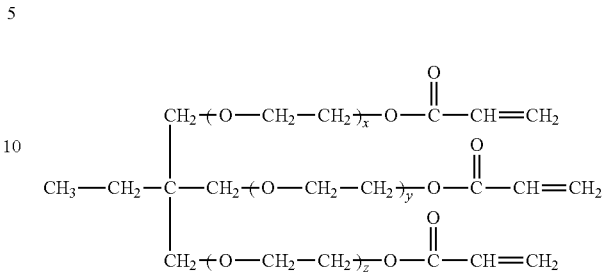

where x is from about 1 to about 10, y is from about 1 to about 10, z is from about 1 to about 10, and the sum of x+y+z is from about 3 to about 24.

5. A memory cell in accordance with claim 4 wherein x is from about 1 to about 6, y is from about 1 to about 6, z is from about 1 to about 6, and the sum of x+y+z is from about 3 to about 16.

6. A memory cell in accordance with claim 1 wherein said polyester acrylic resin has a viscosity at 23° C. of from about 10,000 cps to about 200,000 cps.

7. A memory cell in accordance with claim 2 wherein said silicone acrylate oligomer is a siliconized urethane acrylate.

8. A memory cell in accordance with claim 3 wherein said fluorinated acrylate oligomer is represented by the following formula

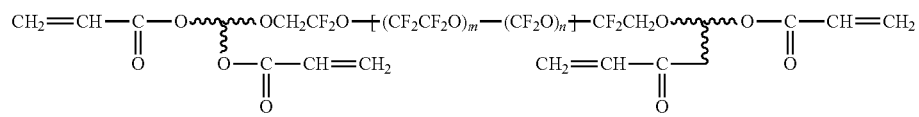

where m is from 1 to about 25, and n is from 1 to about 25.

9. A memory cell in accordance with claim 1 wherein said photoinitiator is comprised of a mixture of a triphenyl phosphine oxide, a trimethylbenzophenone, and a polymeric hydroxy ketone, or is comprised of an (ethyl-2,4,6 trimethylbenzoylphenyl phosphinate).

10. A memory cell comprising a protective layer in the form of a crosslinked mixture of a polyether-modified acrylate oligomer; a polyester acrylic resin; a component selected from the group consisting of a silicone acrylate oligomer and a fluorinated acrylate oligomer, and a photoinitiator, further comprising a flexible substrate layer, a first electrode in contact with the flexible substrate layer, a ferroelectric memory layer in contact with the first electrode, a second electrode in contact with the ferroelectric layer, and the protective layer in contact with the second electrode without an intervening layer between the protective layer and the second electrode.

11. A memory device comprising a plurality of memory cells, each memory cell in accordance with claim 1.

12. A memory cell in accordance with claim 1 wherein polyether-modified acrylate oligomer is represented by the following formula/structure

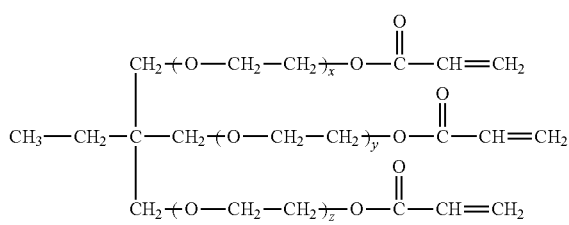

wherein x is 2, y is 2, and z is 2.

13. A memory cell in accordance with claim 7, wherein the siliconized urethane acrylate has a functionality of 2, a glass transition temperature of −37° C., a surface tension of 22 dyne/cm, and a viscosity at 60° C. of 1,820 cps.

14. A memory cell in accordance with claim 1 wherein the polyether-modified acrylate oligomer has the formula

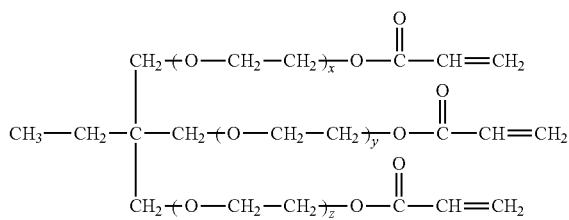

wherein x is 2, y is 2, and z is 2;
the polyester acrylic resin has a viscosity at 23° C. of from about 10,000 cps to about 200,000 cps;
the component is the silicone acrylate oligomer which is a siliconized urethane acrylate;
and wherein the photoinitiator is comprised of a mixture of a triphenyl phosphine oxide, a trimethylbenzophenone, and a polymeric hydroxy ketone, or is comprised of an (ethyl-2,4,6 trimethylbenzoylphenyl phosphinate).

15. A memory cell in accordance with claim 10 wherein the polyether-modified acrylate oligomer, the polyester acrylic resin, the component, and the photoinitiator are present at a ratio in a range of from about 30/62/4/4 to about 48/49/1/2.

16. A memory cell in accordance with claim 1, the crosslinked mixture consisting of the polyether-modified acrylate oligomer, the polyester acrylic resin, the component, the photoinitiator; and optionally, one or more of a diacrylate reactive component, a solvent, and an amine synergist.

17. A memory cell in accordance with claim 16, wherein the polyether-modified acrylate oligomer has the formula

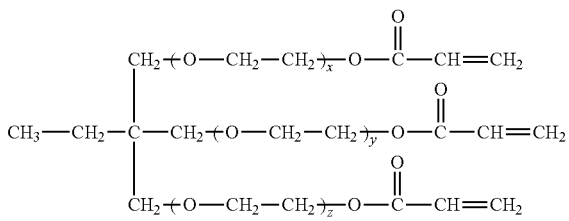

wherein x is 2, y is 2, and z is 2;
the polyester acrylic resin has a viscosity at 23° C. of from about 10,000 cps to about 200,000 cps;
the component is the silicone acrylate oligomer which is a siliconized urethane acrylate;
wherein the photoinitiator is comprised of a mixture of a triphenyl phosphine oxide, a trimethylbenzophenone, and a polymeric hydroxy ketone, or is comprised of an (ethyl-2,4,6 trimethylbenzoylphenyl phosphinate).

18. A memory cell in accordance with claim 17, further comprising a flexible substrate layer, a first electrode in contact with the flexible substrate layer, a ferroelectric memory layer in contact with the first electrode, a second electrode in contact with the ferroelectric layer, and the protective layer in contact with the second electrode without an intervening layer between the protective layer and the second electrode.

* * * * *